United States Patent
Song

(10) Patent No.: US 7,095,665 B2
(45) Date of Patent: Aug. 22, 2006

(54) SENSE AMPLIFIER DRIVER AND SEMICONDUCTOR DEVICE COMPRISING THE SAME

(75) Inventor: Tae-joong Song, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/323,855

(22) Filed: Dec. 30, 2005

(65) Prior Publication Data

US 2006/0120184 A1   Jun. 8, 2006

Related U.S. Application Data

(62) Division of application No. 10/798,520, filed on Mar. 11, 2004, now Pat. No. 7,012,847.

(30) Foreign Application Priority Data

Jun. 25, 2003   (KR) .................................. 03-041448

(51) Int. Cl.
*G11C 7/00* (2006.01)
(52) U.S. Cl. ....................... 365/205; 365/207; 365/233
(58) Field of Classification Search ................ 365/205, 365/207, 233, 189.08
See application file for complete search history.

(56) References Cited

U.S. PATENT DOCUMENTS

| | | | | |
|---|---|---|---|---|
| 5,140,199 A | * | 8/1992 | Seo | 365/233 |
| 5,715,212 A | | 2/1998 | Tanida et al. | 365/233.5 |
| 5,886,946 A | | 3/1999 | Ooishi | 365/233 |
| 6,021,087 A | | 2/2000 | Bosshart | 365/230.06 |
| 6,469,557 B1 | | 10/2002 | Hirabayashi | 327/263 |
| 6,628,564 B1 | * | 9/2003 | Takita et al. | 365/207 |
| 6,738,296 B1 | | 5/2004 | Sung et al. | 365/189.07 |
| 6,996,019 B1 | * | 2/2006 | Song | 365/205 |

* cited by examiner

*Primary Examiner*—Huan Hoang
(74) *Attorney, Agent, or Firm*—Mills & Onello LLP

(57) ABSTRACT

Provided are a sense amplifier driver and a semiconductor device comprising the same. The sense amplifier driver outputting an enable signal for enabling a sense amplifier includes a first inverter, which receives an input signal and outputs an output signal swung between a ground voltage and a control voltage that is determined by the amount of an off-current flowing through at least one transistor existing in an inactive memory block, and a second inverter, which receives the output signal of the first inverter and delays and buffers the output signal of the first inverter by a period of time inversely proportional to a level of the control voltage. A point of time when the enable signal is activated varies according to a level of the control voltage. The semiconductor device detects data in response to the enable signal.

6 Claims, 10 Drawing Sheets

SENSE AMPLIFIER DRIVER AND SEMICONDUCTOR DEVICE COMPRISING THE SAME

This application is a divisional of U.S. application Ser. No. 10/798,520, filed on Mar. 11, 2004, which relies for priority upon Korean Patent Application No. 10-2003-0041448, filed on Jun. 25, 2003 now U.S. Pat. No. 7,012,847, the contents of which are herein incorporated by reference in their entirety.

BACKGROUND OF THE INVENTION

1. Field of the Invention

The present invention relates to a semiconductor device, and more particularly, to a sense amplifier driver, which is not affected by an off-current in a semiconductor device manufactured in a high temperature, fast process, and a semiconductor device comprising the same. Further, the present invention relates to a method of generating a sense amplifier enable signal, which is not affected by an off-current, and a method of detecting data using the sense amplifier enable signal.

2. Description of the Related Art

FIG. 1 is a diagram of a conventional memory cell used in a semiconductor device. Referring to FIG. 1, a memory cell 10 is comprised of one transistor 11 and one capacitor 12.

In general, the transistor 11 has a gate connected to a word line WL and one end connected to a bit line BL. The capacitor 12 for storing data is connected between the other end of the transistor 11 and a ground voltage source VSS.

As a deep submicron technology is developed, a threshold voltage of the transistor 11 decreases to improve the performance of the transistor 11. Here, the performance of the transistor 11 can be represented by the amount of a current Idsat that can flow from the transistor 11 in a turn-on state.

However, when the threshold voltage of the transistor 11 decreases, the amount of a current (referred to as 'on-current' hereinafter) that can flow from the transistor 11 in a turn-on state increases, and the amount of a leakage current (referred to as 'off-current' hereinafter) that flows through the transistor in a turn-off state increases.

An off-current Ioff generally changes according to variations in voltage or type of process, for example, according to whether the process is a fast process or a slow process. Here, the fast process is a process for manufacturing a transistor having high on-current Idsat, and the slow process is a process for manufacturing a transistor having low on-current Idsat.

However, under specific conditions, for example, in a high-temperature, fast process, the off-current Ioff increases enough to affect the on-current Idsat. In particular, considering a difference between the on-current Idsat and the off-current Ioff during the high-temperature, fast process in a structure where a plurality of memory cells constitute an array, advantages taken by lowering threshold voltages of the memory cells considerably decrease.

When a memory device provided with a memory cell is designed, there is a limitation in lowering the threshold voltage of the memory cell due to such an off-current.

SUMMARY OF THE INVENTION

The present invention provides a sense amplifier driver, which considers an off-current so that the entire performance of a semiconductor device comprising a memory cell is prevented from deterioration due to an off-current under specific conditions where the off-current sharply increases, for example, in a high-temperature, fast process as a threshold voltage of the memory cell decreases, and a semiconductor device comprising the sense amplifier driver.

The present invention provides a method of generating a sense amplifier enable signal, which is not affected by an off-current, and a method of detecting data using the sense amplifier enable signal.

According to an aspect of the present invention, there is provided a sense amplifier driver which outputs an enable signal for enabling a sense amplifier, the sense amplifier driver comprising: a first inverter, which receives an input signal and outputs an output signal swung between a ground voltage and a control voltage, which is determined by the amount of an off-current flowing through at least one transistor in an inactive memory block; and a second inverter, which receives the output signal of the first inverter and delays and buffers the output signal of the first inverter by a period of time inversely proportional to a level of the control voltage.

A point in time when the enable signal is activated may be varied according to the level of the control voltage.

According to another aspect of the present invention, there is provided a sense amplifier driver comprising a first inverter and a second inverter, wherein the first inverter comprises: a first pull-up transistor having a gate for receiving an input signal, a first electrode for receiving a control voltage inversely proportional to the amount of an off-current flowing through at least one transistor in an inactive memory block, and a second electrode connected to an output terminal of the first inverter; and a first pull-down transistor having a gate for receiving the input signal, a first electrode connected to a ground voltage, and a second electrode connected to the output terminal of the first inverter, and the second inverter comprises: a second pull-up transistor having a gate connected to the output terminal of the first inverter, a first electrode connected to a power voltage, and a second electrode connected to an output terminal of the second inverter; a second pull-down transistor having a gate connected to the output terminal of the first inverter, a first electrode, and a second electrode connected to the output terminal of the second inverter; a first transistor having a gate connected to the first electrode of the first pull-up transistor of the first inverter, a first electrode connected to the ground voltage, and a second electrode connected to the first electrode of the second pull-down transistor; and a capacitor connected between the output terminal of the second inverter and the ground voltage.

The sense amplifier driver may further comprise a second transistor connected between the first electrode of the second pull-down transistor and the second electrode of the first transistor, the second transistor having a gate connected to the first electrode of the first inverter. In one embodiment, a sense amplifier enable signal for enabling a sense amplifier is output from the output terminal of the second inverter.

According to another aspect of the present invention, there is provided a sense amplifier driver comprising N (natural number) inverters connected in a series, wherein an $n-1^{th}$ (n a natural number greater than 2) inverter among the N inverters comprises: a first pull-up transistor having a gate for receiving an input signal, a first electrode for receiving a control voltage determined by the amount of an off-current flowing through a plurality of transistors, and a second electrode connected to an output terminal of the $n-1^{th}$ inverter; and a first pull-down transistor having a gate for receiving the input signal, a first electrode connected to a ground voltage, and a second electrode connected to the output terminal of the n−1$^{th}$ inverter, and an n$^{th}$ inverter among the N inverters comprises: a second pull-up transistor having a gate connected to the output terminal of the n−1$^{th}$ inverter, a first electrode connected to a power voltage, and a second electrode connected to an output terminal of the n$^{th}$ inverter; a second pull-down transistor having a gate connected to the output terminal of the n−1$^{th}$ inverter, a first electrode, and a second electrode connected to the output terminal of the n$^{th}$ inverter; a first transistor having a gate connected to the first electrode of the first pull-up transistor, a first electrode connected to the ground voltage, and a second electrode connected to the first electrode of the second pull-down transistor; and a capacitor connected between the output terminal of the n$^{th}$ inverter and the ground voltage.

In one embodiment, an n−2$^{th}$ inverter among the N number of inverters inverts a clock signal to generate the input signal, and an n+1$^{th}$ inverter among the N inverters is connected to the output terminal of the n$^{th}$ inverter. The sense amplifier driver can also include a second transistor connected between the first electrode of the second pull-down transistor and the second electrode of the first transistor, the second transistor having a gate connected to the first electrode of the n−1$^{th}$ inverter.

According to still another aspect of the present invention, there is provided a memory device comprising: a memory cell array including a plurality of memory cells; a delay control signal generation circuit which generates a delay control signal with a voltage determined by the amount of an off-current flowing through at least one transistor; a sense amplifier driver which receives a clock signal, controls a period of time for which the clock signal is buffered according to the voltage of the delay control signal, and outputs a sense amplifier enable signal; and a sense amplifier which senses and amplifies data of the memory cell array in response to the sense amplifier enable signal.

The sense amplifier driver may include: a first inverter which receives the clock signal, and outputs an output signal swung between the voltage determined by the amount of an off-current and a ground voltage; and a second inverter which receives the output signal of the first inverter, and delays and buffers the output signal of the first inverter by a period of time inversely proportional to a level of the voltage determined by the amount of an off-current.

In one embodiment, the period of time for which the clock signal is delayed is inversely proportional to the voltage of the delay control signal.

In one embodiment, the sense amplifier driver includes: a first inverter which converts the clock signal into a signal swung between the voltage inversely proportional to the amount of an off-current and a ground voltage, and outputs the converted signal; and a second inverter which is connected to the first inverter, controls a period of time for which the output signal of the first inverter is buffered in response to the voltage inversely proportional to the amount of an off-current, and outputs the sense amplifier enable signal. The period of time for which the output signal of the first inverter is buffered is proportional to the amount of off-current.

According to yet another aspect of the present invention, there is provided a memory device comprising: a memory cell array including a plurality of memory cells; a delay control signal generation circuit including a dummy bit line and a complementary dummy bit line which are precharged to a predetermined voltage, a plurality of word lines respectively connected to a ground voltage, and a plurality of gate transistors, each gate transistor having a gate connected to a corresponding word line of the word lines and a first electrode connected to the dummy bit line, a voltage of the dummy bit line being determined according to a voltage drop due to an off-current flowing through the plurality of gate transistors; a sense amplifier driver which receives a clock signal, controls a period of time for which the clock signal is buffered according to the voltage of the dummy bit line, and outputs a sense amplifier enable signal; and a sense amplifier which senses and amplifies data of the memory cell array in response to the sense amplifier enable signal.

In one embodiment, the period of time for which the clock signal is buffered is inversely proportional to the voltage of the dummy bit line.

The sense amplifier driver can includes: a first inverter which receives the clock signal, and outputs an output signal swung between the voltage of the dummy bit line and a ground voltage; and a second inverter which receives the output signal of the first inverter, and delays and buffers the output signal of the first inverter by a period of time inversely proportional to a level of the voltage of the dummy bit line.

According to another aspect of the present invention, there is provided a memory device comprising: a memory cell array including a plurality of memory cells; a delay control signal generation circuit having a first electrode precharged to a power voltage and a gate and a second electrode commonly connected to a ground voltage; a sense amplifier driver which receives a clock signal, controls a period of time for which the clock signal is buffered according to a voltage of the first electrode, and outputs a sense amplifier enable signal; and a sense amplifier which senses and amplifies data of the memory cell array in response to the sense amplifier enable signal.

In one embodiment, the sense amplifier driver includes: a first inverter which receives the clock signal, and outputs an output signal swung between the voltage of the first electrode and a ground voltage; and a second inverter which receives the output signal of the first inverter, and delays and buffers the output signal of the first inverter by a period of time inversely proportional to a level of the voltage of the first electrode.

According to another aspect of the present invention, there is provided a method of outputting an enable signal for enabling a sense amplifier, comprising: receiving an input signal and outputting an output signal swung between a ground voltage and a control voltage which is inversely proportional to the amount of an off-current flowing through at least one transistor in an inactive memory block; and receiving the output signal, delaying and buffering the output signal by a period of time inversely proportional to a level of the control voltage, and outputting the enable signal.

In one embodiment, a point of time when the enable signal is activated is varied according to the level of the control voltage.

According to another aspect of the present invention, there is provided a method of detecting data comprising: generating a delay control signal with a voltage determined by the amount of an off-current flowing through at least one transistor; receiving a clock signal, controlling a period of time for which the clock signal is buffered according to the delay control signal, and outputting a sense amplifier enable signal; and sensing and amplifying data of a memory cell array in response to the sense amplifier enable signal.

The sense amplifier enable signal generation step may include: receiving the clock signal and outputting an output signal swung between the voltage determined by the amount of an off-current and a ground voltage; and receiving the output signal, delaying and buffering the output signal by a period of time inversely proportional to a level of the voltage determined by the amount of an off-current, and outputting the sense amplifier enable signal.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
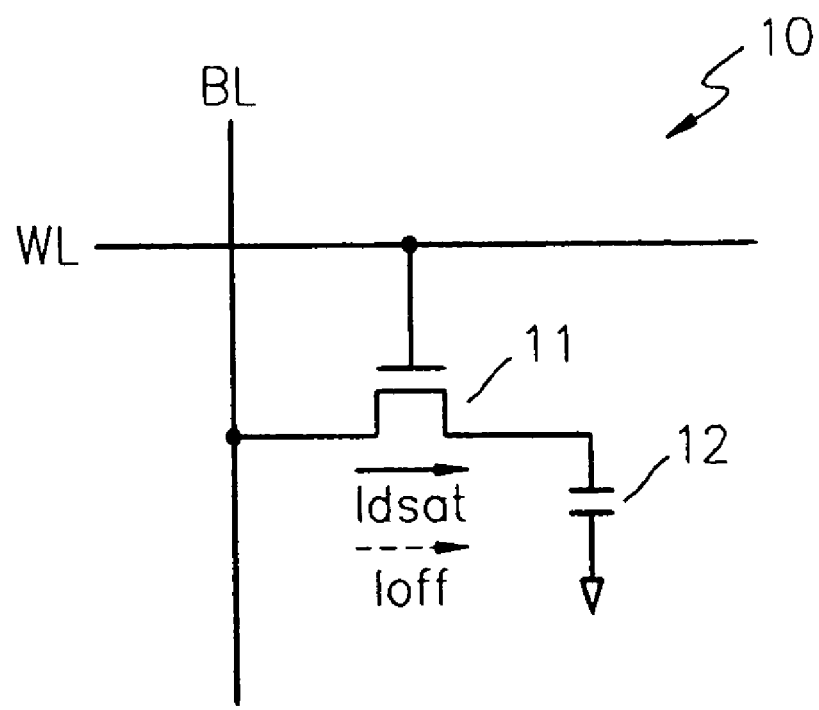
FIG. 1 is a diagram of a conventional memory cell used in a semiconductor memory device.
Figure 2:
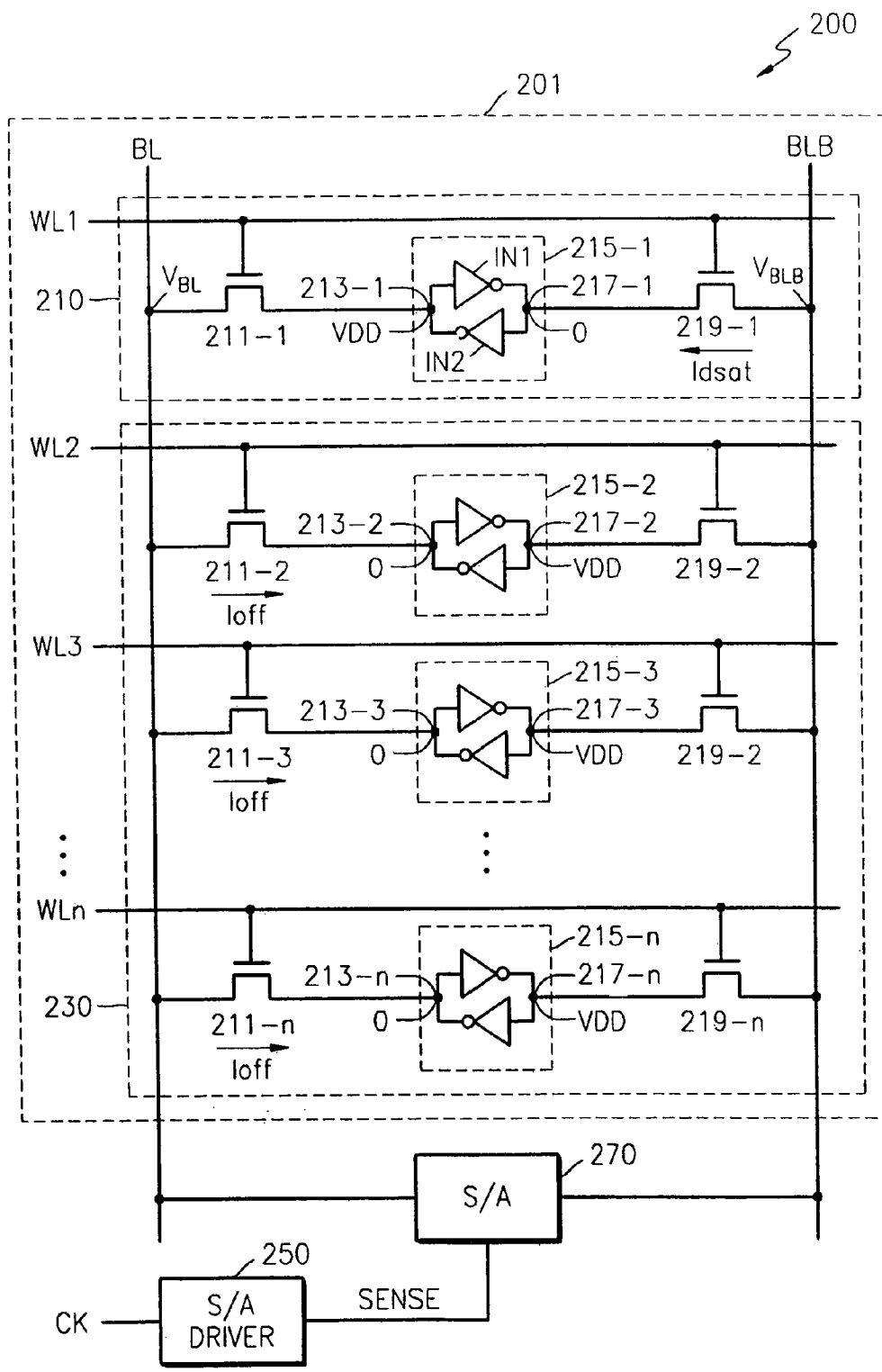
FIG. 2 is a block diagram of a semiconductor device comprising a conventional sense amplifier driver.

FIG. 2 is a block diagram of a semiconductor device comprising a conventional sense amplifier driver. Referring to FIG. 2, a semiconductor device 200 includes a memory cell array 201, a sense amplifier driver 250, and a sense amplifier 270.

The memory cell array 201 includes a first memory block 210 and a second memory block 230. The memory cell array 201 is comprised of a plurality of transistors 211-1, 211-2, 211-3, ..., 211-n, 219-1, 219-2, ..., 219-n, and a plurality of data storage circuits 215-1, 215-2, 215-3, ..., 215-n.

It is assumed that the memory cell array 201 shown in FIG. 2 is structured to be most affected by an off-current in the row direction.

The plurality of data storage circuits 215-1 215-2, 215-3, ..., 215-n are latches respectively including two inverters.

Each inverter is a complementary metal oxide semiconductor (CMOS) inverter including one P-channel metal oxide semiconductor (PMOS) transistor and one N-channel metal oxide semiconductor (NMOS) transistor, which are connected in series.

The sense amplifier driver 250 receives a clock signal CK, and generates a sense amplifier enable signal SENSE for enabling the sense amplifier 270 after a predetermined period of time passes.

The sense amplifier 270 senses and amplifies a voltage difference between a bit line BL and a complementary bit line BLB in response to the sense amplifier enable signal SENSE.

For example, it is assumed that a voltage $V_{BL}$ of the bit line BL and a voltage $V_{BLB}$ of the complementary bit line BLB are precharged to a power voltage VDD, a voltage of each of nodes 217-1, 213-2, 213-3, ..., 213-n is 0V, and a voltage of each of nodes 213-1, 217-2, 217-3, ..., 217-n is a power voltage VDD. Here, when only one word line WL1 among a plurality of word lines WL1, WL2, WL3, ..., WLn is activated, the voltage $V_{BLB}$ of the complementary bit line BLB is expressed as shown in Equation 1.

$$V_{BLB} = VDD - \Delta V1 \quad \text{[Equation 1]}$$

Here, $\Delta V1$ represents a voltage drop due to an on-current Idsat. The on-current Idsat flows to a ground voltage through the transistor 219-1 and the NMOS transistor of the inverter IN1. Therefore, the magnitude of $\Delta V1$ is determined by the on-current Idsat.

In this case, the voltage $V_{BL}$ of the bit line BL is expressed as shown in Equation 2.

$$V_{BL} = VDD - \Delta V2 \quad \text{[Equation 2]}$$

Here, $\Delta V2$ represents a voltage drop due to an off-current Ioff. In this case, it is assumed that all of the off-currents flowing through the transistors 211-2, 211-3, ..., 211-n of the second memory block 230 are the same.

The off-current Ioff flows to a ground voltage through the transistors 211-2, 211-3, ..., 211-n (natural number) and the NMOS transistors of the inverters. Therefore, the magnitude of $\Delta V2$ is determined by the off-current. As a result, the first memory block 210 is an active block and the second block 230 is an inactive block.

The sense amplifier driver 250 generates the sense amplifier enable signal SENSE when a voltage difference VD expressed as shown in Equation 3 is generated between the voltage $V_{BL}$ of the bit line BL and the voltage $V_{BLB}$ of the complementary bit line BLB after the word line WL1 is activated.

$$VD = V_{BL} - V_{BLB} = \Delta V1 - \Delta V2 \quad \text{[Equation 3]}$$

Therefore, the performance of the semiconductor device, for example, a data access time, is determined by a period of time required to form the voltage difference VD. Here, the voltage difference VD represents a margin of the semiconductor device.

When a transistor is manufactured using deep submicron technology, if a threshold voltage of the transistor decreases, both an on-current Idsat and an off-current Ioff increase.

Since the off-current Ioff increases more than the on-current Idsat in a high-temperature, fast process, a period of time required to form the voltage difference VD is longer. Thus, a margin of the semiconductor device provided with the transistor manufactured in the high temperature, fast process is reduced.

Figure 3:
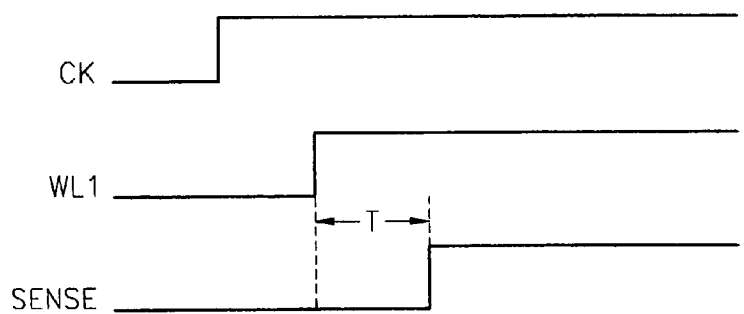
FIG. 3 is a timing diagram illustrating input/output waveforms of the sense amplifier driver shown in FIG. 2.

FIG. 3 is a timing diagram illustrating input/output waveforms of the sense amplifier driver shown in FIG. 2. Referring to FIG. 3, a time T represents a period of time from when the word line WL1 is activated until the sense amplifier enable signal SENSE is activated. The time T is determined by a semiconductor manufacturer and is constant.

For example, it is assumed that a time T required to form the voltage difference VD of 100 mv is 100 ms. Even though the time necessary to form the voltage difference VD of 100 mv increases to 150 ms due to increments of the off-current Ioff, the sense amplifier enable signal SENSE is unconditionally activated after 100 ms since the word line WL1 is activated.

Thus, since the sense amplifier 270 is activated under a condition where the voltage $V_{BL}$ of the bit line BL and the voltage $V_{BLB}$ of the complementary bit line BLB are not sufficiently evaluated, the sense amplifier 270 cannot detect exact data on the bit line BL and the complementary bit line BLB, thereby deteriorating the performance of the sense amplifier 270.

Figure 4:
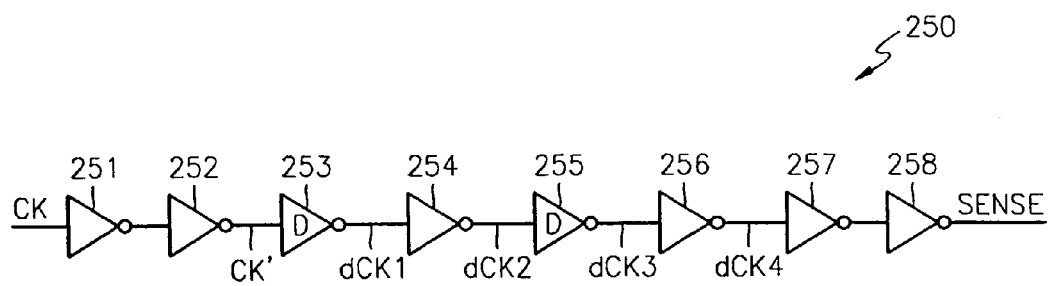
FIG. 4 is a block diagram of the sense amplifier driver shown in FIG. 2.

FIG. 4 is a block diagram of the sense amplifier driver shown in FIG. 2. Referring to FIG. 4, the sense amplifier driver 250 includes a plurality of inverters 251 to 258 connected in a series. The sense amplifier driver 250 buffers the clock signal CK and generates the sense amplifier enable signal SENSE.

Here, each of the inverters 253 and 255 delays an input signal input to an input terminal by a predetermined period of time, and outputs the delayed signal to an output terminal. The delay time is determined at a point of time when each of the inverters 253 and 255 is manufactured.

Figure 5:
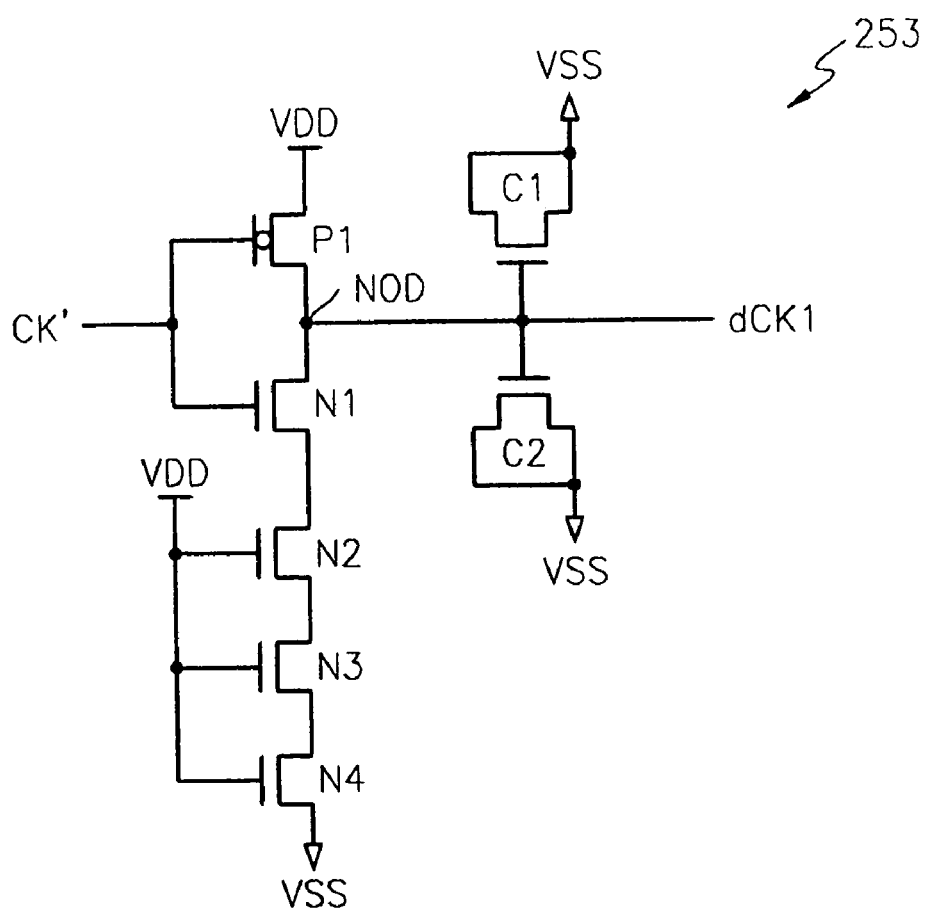
FIG. 5 is a detailed circuit diagram of an inverter of the sense amplifier driver shown in FIG. 3.

FIG. 5 is a detailed circuit diagram of the each of the inverters 253 and 255 in the sense amplifier driver shown in FIG. 4. Referring to FIGS. 4 and 5, an input signal CK' is input to a gate of a PMOS transistor P1 and an NMOS transistor N1, and a plurality of transistors P1, N1, N2, N3, and N4 are connected in a series between a power voltage source VDD and a ground voltage source VSS.

Furthermore, a power voltage VDD is input to a gate of each of the NMOS transistors N2, N3, and N4. Capacitors C1 and C2 comprised of NMOS transistors are connected to an output terminal NOD of the inverter 253. Thus, a delay time is determined by turn-on resistance of the NMOS transistors N2, N3, and N4 connected in a series and capacitance of the capacitors C1 and C2.

Figure 6:
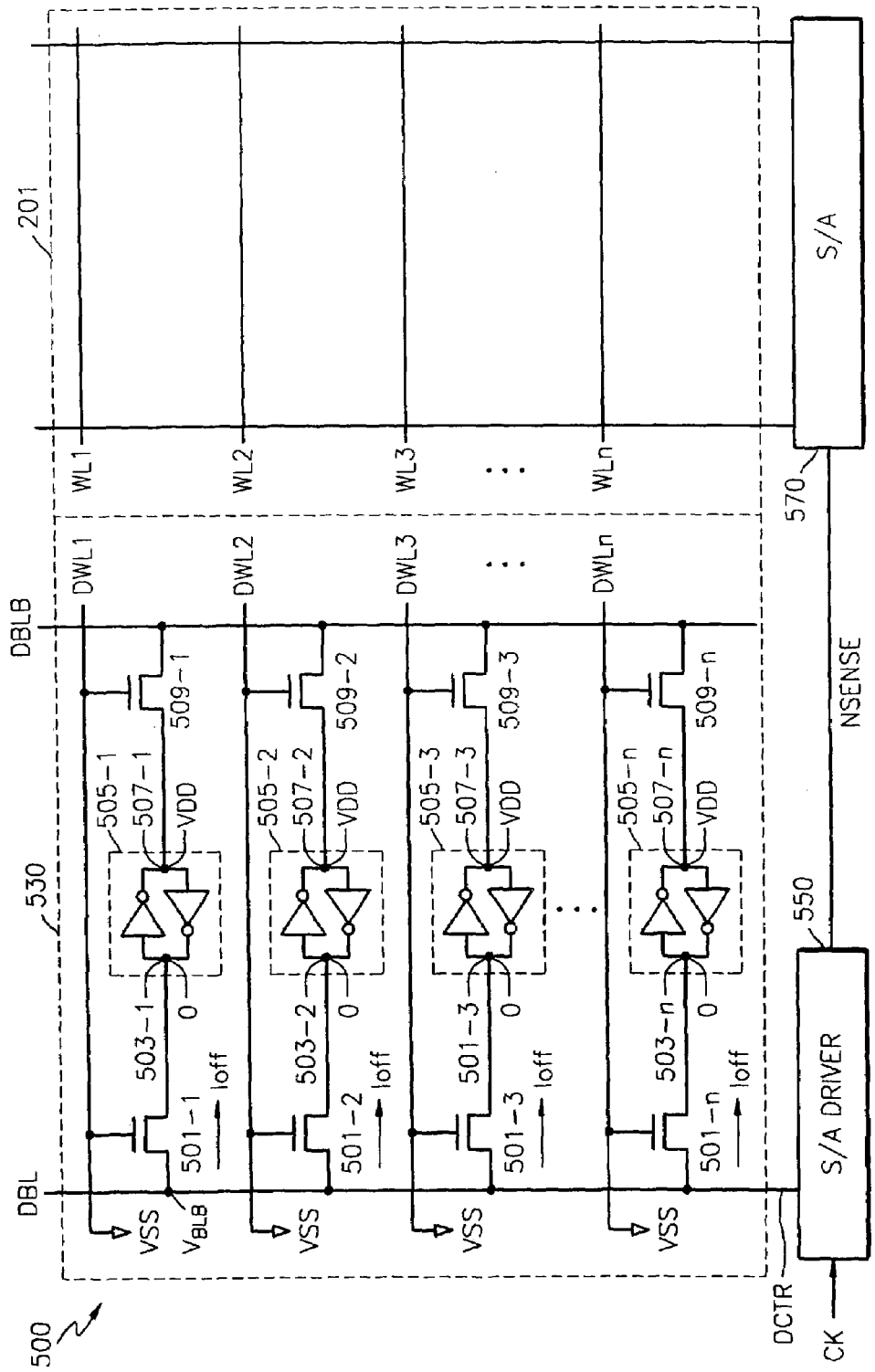
FIG. 6 is a block diagram of a semiconductor device comprising a sense amplifier driver according to the present invention.

FIG. 6 is a block diagram of a semiconductor device comprising a sense amplifier driver according to the present invention. Referring to FIG. 6, a semiconductor device 500 includes a memory cell array 201, a delay control signal generation circuit 530, a sense amplifier driver 550, and a sense amplifier 570.

The structure and operation of the memory cell array 201 are the same as those of the memory cell array shown in FIG. 2. For convenience in description, the memory cell array 201 is illustrated to include a plurality of memory cells connected to one bit line BL and one complementary bit line BLB.

The delay control signal generation circuit 530 includes a dummy bit line DBL, a complementary dummy bit line DBLB, a plurality of dummy word lines DWL1 to DWLn, a plurality of gate transistors 501-1 to 501-n and 509-1 to 509-n, and a plurality of storage circuits 505-1 to 505-n.

The plurality of dummy word lines DWL1 to DWLn are respectively connected to ground voltage VSS. The dummy bit line DBL and the complementary dummy bit line DBLB are precharged to a power voltage VDD when the semiconductor device 500 performs a precharge operation.

It is assumed that each of nodes 503-1 to 503-n is connected to a ground voltage VSS, and a voltage of each of nodes 507-1 to 507-n is equal to a power voltage VDD, and off-currents Ioff flowing through the plurality of gate transistors 501-1 to 501-n are the same.

Each of the transistors 501-1 to 501-n has a gate connected to a corresponding dummy word line among the word lines DWL1, DWL2, DWL3, . . . , DWLn, and a first electrode connected to the dummy bit line DBL.

A voltage $V_{DBL}$ of the dummy bit line DBL is determined by a voltage drop due to the sum of the off-currents Ioff flowing through the plurality of transistors 501-1 to 501-n. That is to say, the voltage $V_{DBL}$ of the dummy bit line DBL is expressed as shown in Equation 4.

$$V_{DBL} = VDD - \Delta V3 \qquad \text{[Equation 4]}$$

Here, $\Delta V3$ represents the voltage drop due to the sum of the off-currents flowing through the plurality of transistors 501-1 to 501-n. It is preferable that $\Delta V3$ is substantially equal or similar to $\Delta V2$. The voltage $V_{DBL}$ of the dummy bit line DBL is called a control voltage or a delay control signal DCTR.

The sense amplifier driver 550 receives a clock signal CK, and controls a point of time when a sense amplifier enable signal NSENSE is activated according to the control voltage DCTR. That is, the sense amplifier driver 550 receives the clock signal CK, controls a period of time for which the clock signal CK is buffered according to the control voltage DCTR, and outputs the sense amplifier enable signal NSENSE.

The sense amplifier 570 senses and amplifies data stored in a first memory block 210 of the memory cell array 201 in response to the sense amplifier enable signal NSENSE.

Figure 7:
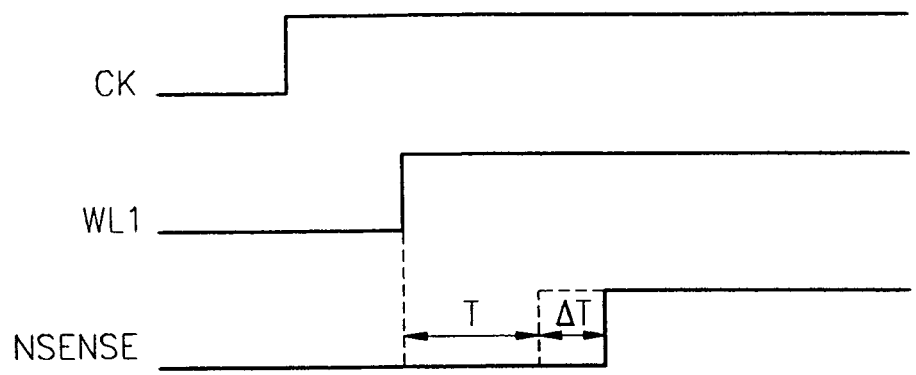
FIG. 7 is a timing diagram illustrating input/output waveforms of the sense amplifier driver shown in FIG. 6.

FIG. 7 is a timing diagram illustrating input/output waveforms of the sense amplifier driver shown in FIG. 6. Referring to FIGS. 6 and 7, the sense amplifier driver 550 outputs the activated sense amplifier enable signal NSENSE after a predetermined period of time for which a word line WL1 has been activated. Here, $\Delta T$ represents a delay time which varies according to a level of the delay control signal DCTR.

For example, it is assumed that a time T required to form a voltage difference VD of 100 mv is 100 ms. When the time necessary to form the voltage difference VD of 100 mv increases to 150 ms due to increments of the off-current Ioff, the sense amplifier driver according to the present invention activates the sense amplifier enable signal NSENSE after 150 ms for which the word line WL1 has been activated.

Since the sense amplifier 570 is activated after a voltage VBL' of the bit line BL and a voltage VBLB' of the complementary bit line BLB are sufficiently evaluated, the sense amplifier 270 can detect exact data on the bit line BL and data on the complementary bit line BLB.

Figure 8:
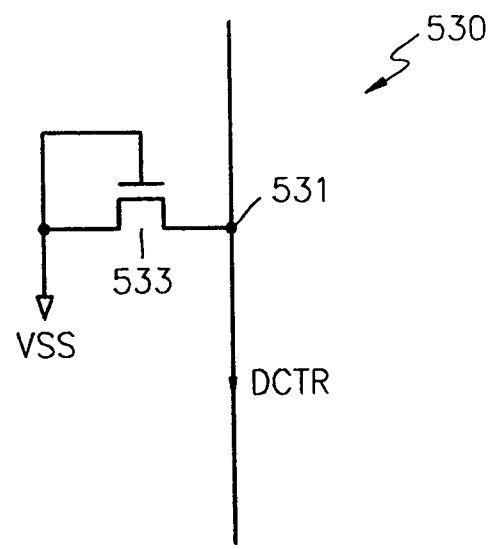
FIG. 8 is a circuit diagram of a delay control signal generation circuit of the sense amplifier driver shown in FIG. 6 according to a preferred embodiment of the present invention.

FIG. 8 is a circuit diagram of the delay circuit signal generation circuit in the sense amplifier driver shown in FIG. 6 according to a preferred embodiment of the present invention. Referring to FIG. 8, the delay control signal generation circuit 530 is comprised of one transistor 533 with a large β ratio that is a channel width to length ratio. The transistor 533 has a gate and a second electrode connected to a ground voltage VSS, and a first electrode for generating the delay control signal DCTR.

It is preferable that a voltage of the first electrode is equal to the voltage $V_{BL'}$ of the bit line BL or the voltage $V_{DBL}$ of the dummy bit line DBL.

Figure 9:
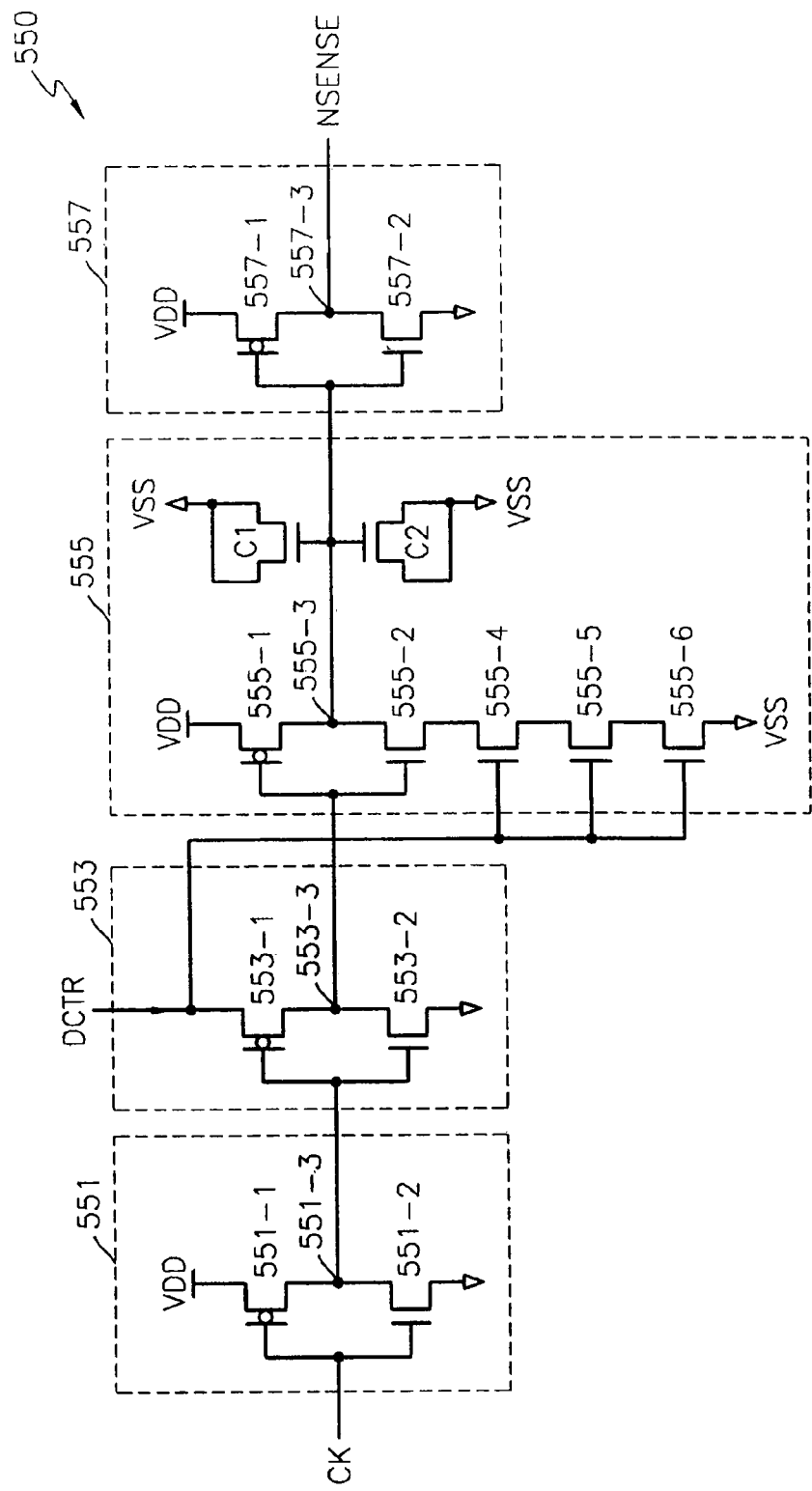
FIG. 9 is a circuit diagram of a first example of the sense amplifier driver shown in FIG. 6.

FIG. 9 is a circuit diagram of a first example of the sense amplifier driver shown in FIG. 6. Referring to FIG. 9, the sense amplifier driver 550 includes a plurality of inverters 551, 553, 555, and 557 connected in a series. The plurality of inverters are preferably even-numbered.

The sense amplifier driver 550 receives the clock signal CK, controls the period of time for which the clock signal CK is buffered according to the voltage of the delay control signal DCTR, and outputs the sense amplifier enable signal NSENSE.

The inverter 551 is comprised of one PMOS transistor 551-1 and one NMOS transistor 551-2 connected in a series between a power voltage VDD and a ground voltage VSS.

The inverter 553 is comprised of one PMOS transistor 553-1 and one NMOS transistor 553-2. Each of the MOS transistors 553-1 and 553-2 has a gate connected to an output terminal 551-3 of the inverter 551.

The delay control signal DCTR is input to a source of the pull-up transistor 553-1. Thus, a pull-up level of an output terminal 553-3 is determined by the delay control signal DCTR. That is, an output signal of the inverter 553 is swung between the control voltage DCTR and a ground voltage VSS. The control voltage DCTR is inversely proportional to the amount of an off-current flowing through at least one transistor, namely, the amount of leakage current flowing through at least one transistor in an off state.

The inverter 555 controls a buffering time. Each of MOS transistors 555-1 and 555-2 has a gate connected to the output terminal 553-3 of the inverter 553. Since the delay control signal DCTR is input to each gate of NMOS transistors 555-4, 555-5, and 555-6 connected in a series, an on-current flowing through the NMOS transistors 555-4, 555-5, and 555-6 is determined by the delay control signal DCTR.

Capacitors C1 and C2 are each connected between an output terminal 555-3 and a ground voltage VSS. Each of the capacitors C1 and C2 may consist of an NMOS transistor. Therefore, a time constant of the inverter 555 is determined by a turn-on resistance of the NMOS transistors 555-4, 555-5, and 555-6 connected in a series and a capacitance of the capacitors C1 and C2. As a result, the inverter 555 can control a buffering time of a signal input to the inverter 555 in response to the delay control signal DCTR.

The inverter 557 is comprised of one PMOS transistor 557-1 and one NMOS transistor 557-2 which are connected in a series between a power voltage VDD and a ground voltage VSS. Each of the MOS transistors 557-1 and 557-2 has a gate connected to the output terminal 555-3 of the inverter 555. A signal of an output terminal 557-3 of the inverter 557 is the sense amplifier enable signal NSENSE.

Figure 10:
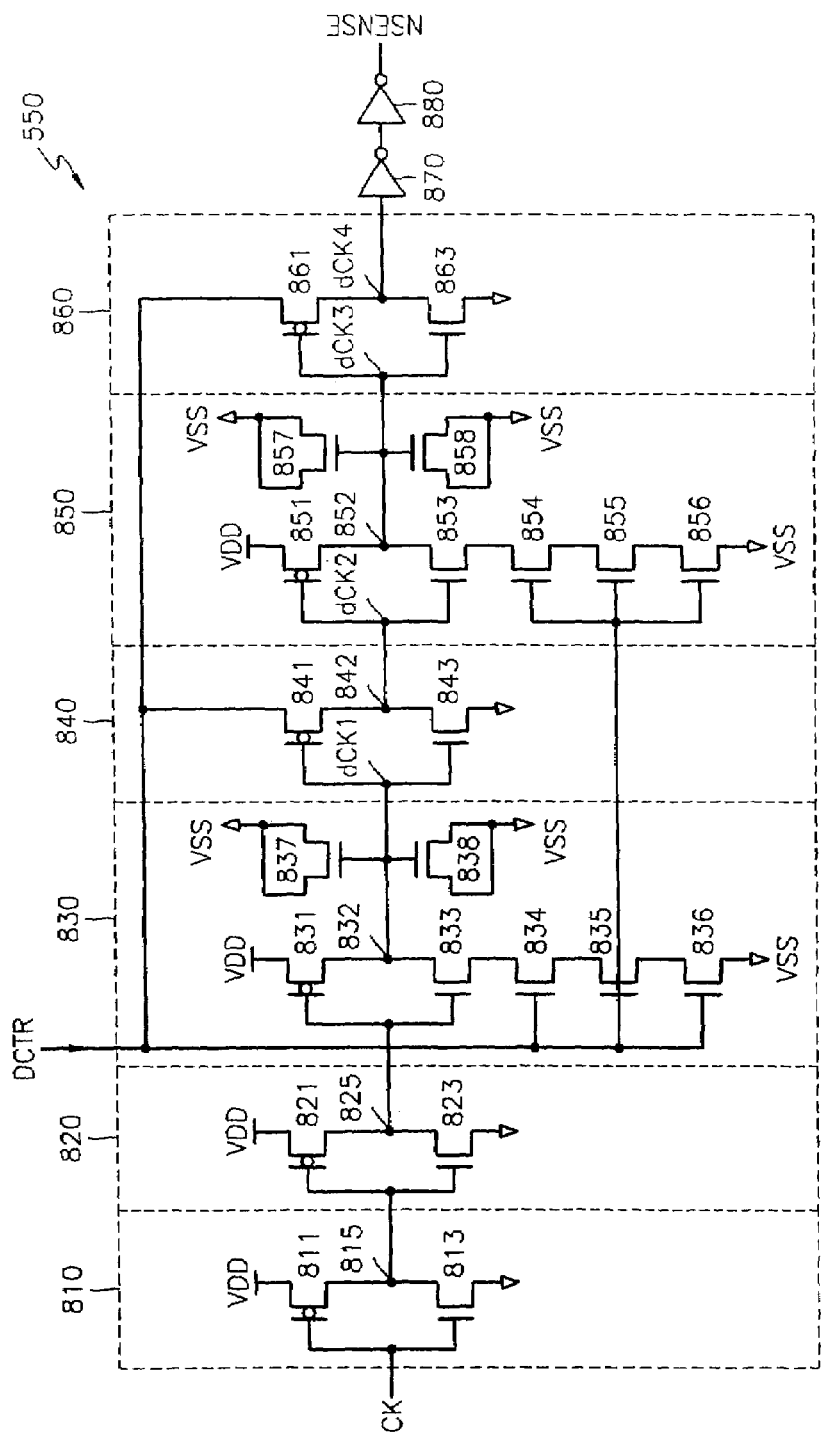
FIG. 10 is a circuit diagram of a second example of the sense amplifier driver shown in FIG. 6.

FIG. 10 is a circuit diagram of a second example of the sense amplifier driver shown in FIG. 6. Referring to FIG. 10, the sense amplifier driver 550 includes a plurality of inverters 810 to 880 connected in series.

The sense amplifier driver 550 receives the clock signal CK, delays the clock signal CK by a predetermined period of time in response to the delay control signal DCTR, and outputs the sense amplifier enable signal NSENSE.

The inverter 810 is comprised of one PMOS transistor 811 and one NMOS transistor 813 which are connected in series between a power voltage VDD and a ground voltage VSS. The clock signal CK is input to a gate of each of the MOS transistors 811 and 813. The inverter 810 outputs an output signal swung between the power voltage VDD and the ground voltage VSS.

The inverter 820 is comprised of one PMOS transistor 821 and one NMOS transistor 823 which are connected in series between a power voltage VDD and a ground voltage VSS. Each of the MOS transistors 821 and 823 has a gate connected to an output terminal 815 of the inverter 810. The inverter 820 outputs an output signal swung between the power voltage VDD and the ground voltage VSS.

The inverter 830 is comprised of a plurality of MOS transistors 831, 833, 834, 835, and 836 which are connected in series between a power voltage VDD and a ground voltage VSS.

Each of the MOS transistors 831 and 833 has a gate connected to an output terminal 825 of the inverter 820. The NMOS transistor 833 is connected to an output terminal 832 and a drain of the NMOS transistor 834.

The delay control signal DCTR is input to a gate of each of the NMOS transistors 834, 835, and 836, and thus, an on-current flowing through the NMOS transistors 834, 835, and 836 is determined by the delay control signal DCTR.

Each of capacitors 837 and 838 is connected between the output terminal 832 and a ground voltage VSS, and may consist of an NMOS transistor.

Therefore, a delay time of the inverter 830 is determined by a resistance of the NMOS transistors 834, 835, and 836 connected in series and a capacitance of the capacitors 837 and 838. The inverter 830 outputs an output signal swung between the power voltage VDD and the ground voltage VSS.

The inverter 840 is comprised of one PMOS transistor 841 and one NMOS transistor 843 connected in series. Each of the MOS transistors 841 and 843 has a gate connected to the output terminal 832 of the inverter 830. The delay control signal DCTR is input to a source of the PMOS transistor 841. The NMOS transistor 843 is connected between an output terminal 842 and a ground voltage.

The inverter 850 is comprised of a plurality of MOS transistors 851, 853, 854, 855, and 856 which are connected in series between a power voltage VDD and a ground voltage VSS.

Each of the MOS transistors 851 and 853 has a gate connected to the output terminal 842 of the inverter 840. The PMOS transistor 851 is connected between the power voltage VDD and an output terminal 852. The NMOS transistor 853 is connected to the output terminal 852 and a drain of the NMOS transistor 854.

The delay control signal DCTR is input to a gate of each of the NMOS transistors 854, 855, and 856. Thus, an on-current flowing through the NMOS transistors 854, 855, and 856 is determined by the delay control signal DCTR.

Capacitors 857 and 858 are each connected between the output terminal 852 and a ground voltage VSS, and may consist of an NMOS transistor.

Consequently, a delay time of the inverter 850 is determined by a resistance of the NMOS transistors 854, 855, and 856 connected in series and a capacitance of the capacitors 857 and 858. The inverter 850 outputs an output signal swung between the power voltage VDD and the ground voltage VSS.

The inverter 860 is comprised of one PMOS transistor 861 and one NMOS transistor 863 connected in series. Each of the MOS transistors 861 and 863 has a gate connected to the output terminal 852 of the inverter 850. The delay control signal DCTR is input to a source of the PMOS transistor 861. The NMOS transistor 863 is connected between an output terminal dCK4 and a ground voltage.

An input terminal of the inverter 870 is connected to the output terminal dCK4 of the inverter 860. The inverter 880 inverts an output signal of the inverter 870 and outputs the sense amplifier enable signal NSENSE.

Figure 11:
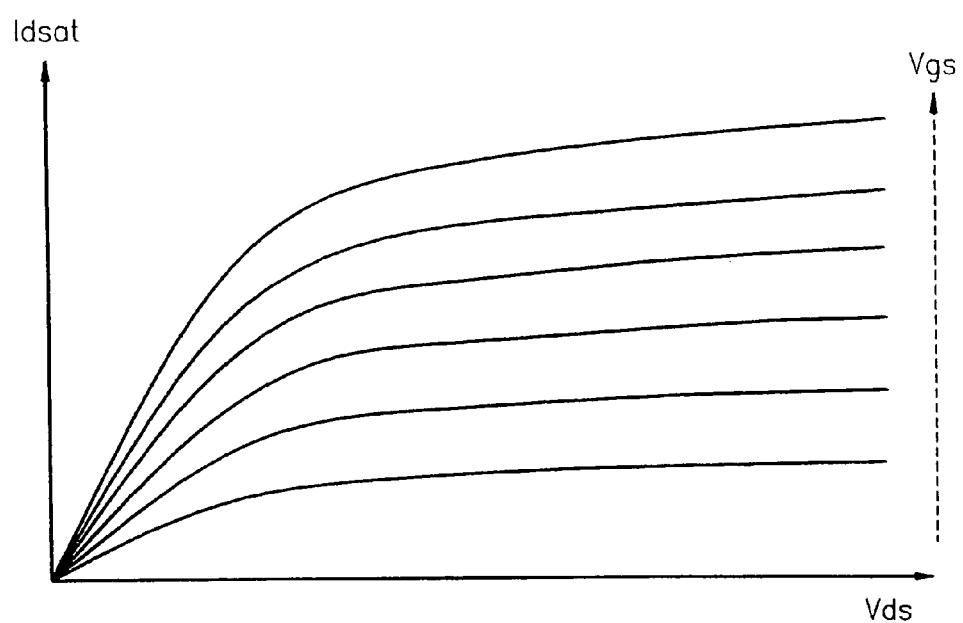
FIG. 11 is a graph illustrating changes in an on-current according to Vds/Vgs variations of a conventional n-channel metal oxide semiconductor (NMOS) transistor, where Vds represents a voltage between a drain and a source of the transistor and Vgs represents a voltage between a gate and the source of the transistor.

FIG. 11 is a graph illustrating changes in on-current according to Vds/Vgs variations of a conventional NMOS transistor, where Vds represents a voltage between a drain and a source of the transistor and Vgs represents a voltage between a gate and the source of the transistor. Referring to FIG. 11, when the voltage Vds is constant, the lower the voltage Vgs, the lower the on-current Idsat.

Referring to FIGS. 6, 10, and 11, when the off-current Ioff is low, the voltage $V_{DBL}$ of the dummy bit line DBL having a power voltage VDD level is transmitted to the output terminals 842 and dCK4 of the inverters 840 and 860.

However, when the off-current Ioff is high, the voltage $V_{DBL}$ of the dummy bit line DBL having a value of VDD−ΔV3 is transmitted to the output terminals 842 and dCK4 of the inverters 840 and 860. In this instance, the voltage applied to each gate of the transistors 834, 835, and 836 connected in series to determine the delay time of the sense amplifier driver 550 becomes lower than the power voltage VDD.

Since the on-current Idsat flowing through the transistors 834, 835, and 836 connected in series decreases, the delay time of the sense amplifier driver 550 increases.

Figure 12:
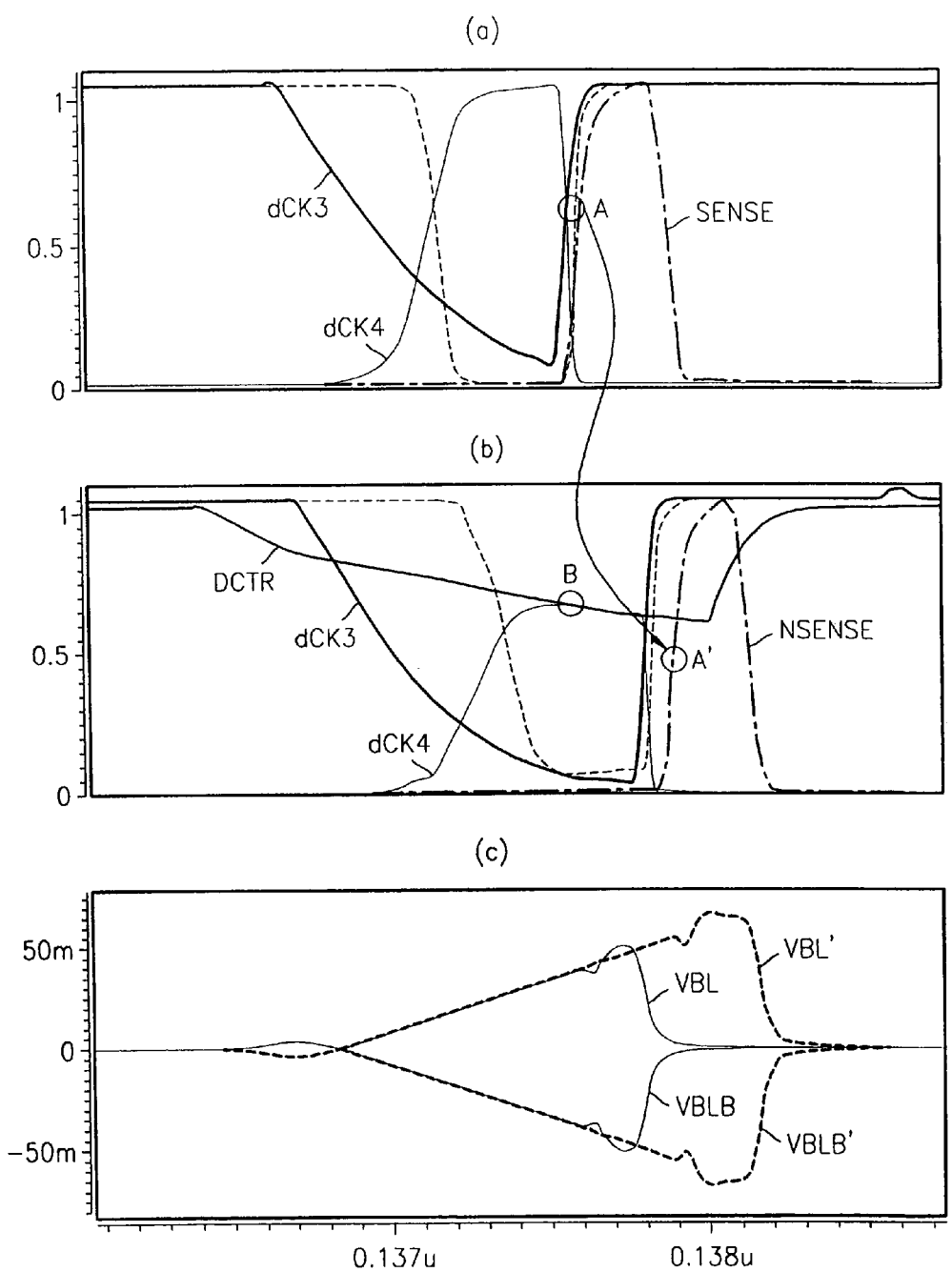
FIG. 12 consists of diagrams illustrating waveforms of nodes of the conventional sense amplifier driver and waveforms of nodes of the sense amplifier driver according to the preferred embodiment of the present invention.

FIG. 12 consists of diagrams illustrating waveforms of nodes of the conventional sense amplifier driver and waveforms of nodes of the sense amplifier driver according to the present invention.

In FIG. 12, diagram (a) illustrate waveforms of the nodes of the sense amplifier driver 250 shown in FIG. 4. Diagram (b) illustrates waveforms of the nodes of the sense amplifier driver 550 shown in FIG. 10.

A case where the off-current is high will be described below with reference to diagrams (a) and (b) in FIG. 12. As shown in diagram (b), since the voltage $V_{DBL}$ of the dummy bit line DBL maintains the value of VDD−ΔV3, an output signal of the output terminal dCK4 of the inverter 860 does not reach the power voltage VDD.

A positional difference between a portion A to a portion A' shows that a predetermined time is delayed by the delay control signal generation circuit 530 and the sense amplifier driver 550.

Diagram (a) illustrates waveforms of the voltage $V_{BL}$ of the bit line and the voltage $V_{BLB}$ of the complementary bit line shown in FIG. 2 and waveforms of the voltage VBL' of the bit line and the voltage VBLB' of the complementary bit line shown in FIG. 6.

As described above, the sense amplifier driver according to the present invention can control a point of time when the sense amplifier enable signal is activated according to the level of an off-current and, accordingly, can increase a memory margin and improve the performance of the sense amplifier which is activated in response to the sense amplifier enable signal.

The performance of the memory device comprising the sense amplifier driver according to the present invention can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A sense amplifier driver comprising a first inverter and a second inverter, wherein the first inverter comprises:

a first pull-up transistor having a gate for receiving an input signal, a first electrode for receiving a control voltage inversely proportional to the amount of an off-current flowing through at least one transistor in an inactive memory block, and a second electrode connected to an output terminal of the first inverter; and a first pull-down transistor having a gate for receiving the input signal, a first electrode connected to a ground voltage, and a second electrode connected to the output terminal of the first inverter, and the second inverter comprises:

a second pull-up transistor having a gate connected to the output terminal of the first inverter, a first electrode connected to a power voltage, and a second electrode connected to an output terminal of the second inverter;

a second pull-down transistor having a gate connected to the output terminal of the first inverter, a first electrode, and a second electrode connected to the output terminal of the second inverter;

a first transistor having a gate connected to the first electrode of the first pull-up transistor of the first inverter, a first electrode connected to the ground voltage, and a second electrode connected to the first electrode of the second pull-down transistor; and a capacitor connected between the output terminal of the second inverter and the ground voltage.

2. The sense amplifier driver of claim 1, further comprising at least one of a plurality of second transistors connected between the first electrode of the second pull-down transistor and the second electrode of the first transistor, each transistor of the plurality of second transistors having a gate connected to the first electrode of the first inverter.

3. The sense amplifier driver of claim 2, wherein a sense amplifier enable signal for enabling a sense amplifier is output from the output terminal of the second inverter.

4. A sense amplifier driver comprising N (natural number) inverters connected in a series, wherein an $n-1^{th}$ (n a natural number greater than 2) inverter among the N inverters comprises:

a first pull-up transistor having a gate for receiving an input signal, a first electrode for receiving a control voltage determined by the amount of an off-current flowing through a plurality of transistors, and a second electrode connected to an output terminal of the $n-1^{th}$ inverter; and a first pull-down transistor having a gate for receiving the input signal, a first electrode connected to a ground voltage, and a second electrode connected to the output terminal of the $n-1^{th}$ inverter, and an $n^{th}$ inverter among the N inverters comprises:

a second pull-up transistor having a gate connected to the output terminal of the $n-1^{th}$ inverter, a first electrode connected to a power voltage, and a second electrode connected to an output terminal of the $n^{th}$ inverter;

a second pull-down transistor having a gate connected to the output terminal of the $n-1^{th}$ inverter, a first electrode, and a second electrode connected to the output terminal of the $n^{th}$ inverter;

a first transistor having a gate connected to the first electrode of the first pull-up transistor, a first electrode connected to the ground voltage, and a second electrode connected to the first electrode of the second pull-down transistor; and a capacitor connected between the output terminal of the $n^{th}$ inverter and the ground voltage.

5. The sense amplifier driver of claim 4, wherein an $n-2^{th}$ inverter among the N inverters inverts a clock signal to generate the input signal, and an $n+1^{th}$ inverter among the N inverters is connected to the output terminal of the $n^{th}$ inverter.

6. The sense amplifier driver of claim 4, further comprising at least one of a plurality of second transistors connected between the first electrode of the second pull-down transistor and the second electrode of the first transistor, each transistor of the plurality of second transistors having a gate connected to the first electrode of the n−1$^{th}$ inverter.

* * * * *